United States Patent
Ban et al.

(10) Patent No.: US 8,028,124 B2
(45) Date of Patent: Sep. 27, 2011

(54) FAST PROCESSING MEMORY ARRAY

(75) Inventors: Oliver Keren Ban, Austin, TX (US);
Xiangang Cheng, Raleigh, NC (US);
Eric James St. Amand, New Paltz, NY (US)

(73) Assignee: International Business Machines Corporation, Armonk, NY (US)

( * ) Notice: Subject to any disclaimer, the term of this patent is extended or adjusted under 35 U.S.C. 154(b) by 432 days.

(21) Appl. No.: 11/961,206

(22) Filed: Dec. 20, 2007

(65) Prior Publication Data
US 2009/0164725 A1 Jun. 25, 2009

(51) Int. Cl.
*G06F 13/20* (2006.01)
(52) U.S. Cl. .......... 711/104; 710/22; 711/216; 711/118; 711/165
(58) Field of Classification Search .................. 711/104, 711/216, 118, 165; 710/22
See application file for complete search history.

(56) References Cited

U.S. PATENT DOCUMENTS

| 5,751,987 | A | 5/1998 | Mahant-Shetti et al. |
| 5,963,481 | A | 10/1999 | Alwais et al. |
| 6,026,478 | A | 2/2000 | Dowling |
| 6,460,120 | B1 | 10/2002 | Bass et al. |
| 6,484,065 | B1 | 11/2002 | Yu et al. |
| 2001/0020254 | A1* | 9/2001 | Blumenau et al. ............ 709/229 |
| 2002/0073282 | A1* | 6/2002 | Chauvel et al. ............... 711/122 |
| 2003/0188086 | A1* | 10/2003 | Singh ............................ 711/104 |

* cited by examiner

*Primary Examiner* — Jae U Yu
(74) *Attorney, Agent, or Firm* — Yee & Associates, P.C.; Steven L. Bennett

(57) ABSTRACT

The illustrative embodiments described herein provide a computer implemented method, apparatus, and computer program product for increasing efficiency associated with data access. In one illustrative embodiment a memory chip is presented comprising of a plurality of memory units for storing data; a plurality of processing units for processing the data; and a word line and a bit line external to the plurality of memory units, wherein the plurality of processing units directly access the word line and the bit line in accessing the data.

11 Claims, 3 Drawing Sheets

FAST PROCESSING MEMORY ARRAY

BACKGROUND OF THE INVENTION

1. Field of the Invention

The present invention relates generally to the data processing field. Still more particularly, the present invention relates to a computer implemented method, apparatus, and computer program product for fast processing memory array.

2. Description of the Related Art

A data processing system is a machine which manipulates data according to a list of instructions. The data processing system may comprise of numerous components, such as, but not limited to, central processing unit(s), memory, networking devices, storage devices, and input and output devices.

Currently, all the components within the data processing system, including memory, are interconnected with the central processing unit via a bus. A bus is a subsystem, often made of groups of wires, that transfers data between computer components. A bus can logically connect several peripherals over the same set of wires. Each bus defines the protocol needed for connecting devices, memory, cards, or cables together.

However, because many of the components within the same data processing system are produced by different manufacturers having different communication standards, the central processing unit is required to recognize all the different protocols needed to communicate with all the components. This level of complexity results in increased costs and slower data processing time.

SUMMARY OF THE INVENTION

The illustrative embodiments described herein provide a computer implemented method, apparatus, and computer program product for increasing efficiency associated with data access. In one illustrative embodiment a memory chip is presented comprising of a plurality of memory units for storing data; a plurality of processing units for processing the data; and a word line and a bit line external to the plurality of memory units, wherein the plurality of processing units directly access the word line and the bit line in accessing the data.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an exemplary embodiment when read in conjunction with the accompanying drawings, wherein:

DETAILED DESCRIPTION OF THE PREFERRED EMBODIMENT

Figure 1:
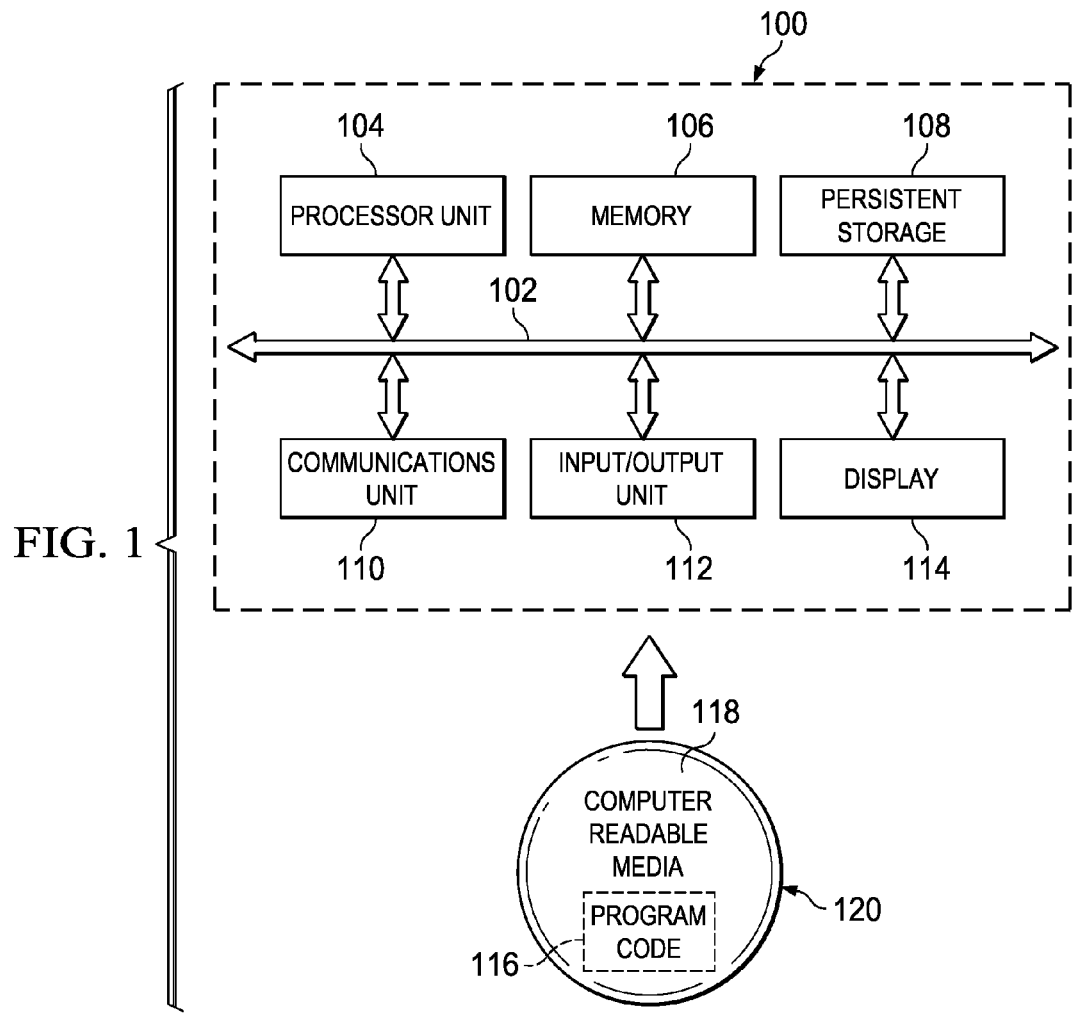
FIG. 1 is a diagram of a data processing system in accordance with an illustrative embodiment.

FIG. 1 is a diagram of a data processing system in accordance with an illustrative embodiment of the present invention. In this illustrative example, data processing system 100 includes communications fabric 102, which provides communications between processor unit 104, memory 106, persistent storage 108, communications unit 110, input/output (I/O) unit 112, and display 114.

Processor unit 104 serves to execute instructions for software that may be loaded into memory 106. Processor unit 104 may be a set of one or more processors or may be a multi-processor core, depending on the particular implementation. Further, processor unit 104 may be implemented using one or more heterogeneous processor systems in which a main processor is present with secondary processors on a single chip. As another illustrative example, processor unit 104 may be a symmetric multi-processor system containing multiple processors of the same type.

The illustrative embodiments may be implemented in a processor, such as processor 104. Processor 104 may be, but is not limited to, a superscalar processor having multiple versions of each functional unit to enable execution of many instructions in parallel. The illustrative embodiments provide a method for increasing the number of instructions per clock cycle associated with processor 104.

Memory 106, in these examples, may be, for example, a random access memory or any other suitable volatile or non-volatile storage device. Persistent storage 108 may take various forms depending on the particular implementation. For example, persistent storage 108 may contain one or more components or devices. For example, persistent storage 108 may be a hard drive, a flash memory, a rewritable optical disk, a rewritable magnetic tape, or some combination of the above. The media used by persistent storage 108 also may be removable. For example, a removable hard drive may be used for persistent storage 108.

Communications unit 110, in these examples, provides for communications with other data processing systems or devices. In these examples, communications unit 110 is a network interface card. Communications unit 110 may provide communications through the use of either or both physical and wireless communications links.

Input/output unit 112 allows for input and output of data with other devices that may be connected to data processing system 100. For example, input/output unit 112 may provide a connection for user input through a keyboard and mouse. Further, input/output unit 112 may send output to a printer. Display 114 provides a mechanism to display information to a user.

Instructions for the operating system and applications or programs are located on persistent storage 108. These instructions may be loaded into memory 106 for execution by processor unit 104. The processes of the different embodiments may be performed by processor unit 104 using computer implemented instructions, which may be located in a memory, such as memory 106. These instructions are referred to as program code, computer usable program code, or computer readable program code that may be read and executed by a processor in processor unit 104. The program code in the different embodiments may be embodied on different physical or tangible computer readable media, such as memory 106 or persistent storage 108.

Program code 116 is located in a functional form on computer readable media 118 that is selectively removable and may be loaded onto or transferred to data processing system 100 for execution by processor unit 104. Program code 116 and computer readable media 118 form computer program product 120 in these examples. In one example, computer readable media 118 may be in a tangible form, such as, for example, an optical or magnetic disc that is inserted or placed into a drive or other device that is part of persistent storage 108 for transfer onto a storage device, such as a hard drive that is part of persistent storage 108. In a tangible form, computer readable media 118 also may take the form of a persistent storage, such as a hard drive, a thumb drive, or a flash memory that is connected to data processing system 100. The tangible form of computer readable media 118 is also referred to as computer recordable storage media. In some instances, computer readable media 118 may not be removable.

Alternatively, program code 116 may be transferred to data processing system 100 from computer readable media 118 through a communications link to communications unit 110 and/or through a connection to input/output unit 112. The communications link and/or the connection may be physical or wireless in the illustrative examples. The computer readable media also may take the form of non-tangible media, such as communications links or wireless transmissions containing the program code.

The illustrative embodiments may be implemented in a memory structure, such as memory 106. The illustrative embodiments provide a memory architecture containing embedded components, such as, but are not limited to, embedded processing unit(s), such as processing unit 104 and communication unit(s), such as communications unit 110.

The different components illustrated for data processing system 100 are not meant to provide architectural limitations to the manner in which different embodiments may be implemented. The different illustrative embodiments may be implemented in a data processing system including components in addition to or in place of those illustrated for data processing system 100. Other components shown in FIG. 1 can be varied from the illustrative examples shown.

As one example, a storage device in data processing system 100 is any hardware apparatus that may store data. Memory 106, persistent storage 108 and computer readable media 118 are examples of storage devices in a tangible form.

In another example, a bus system may be used to implement communications fabric 102 and may be comprised of one or more buses, such as a system bus or an input/output bus. Of course, the bus system may be implemented using any suitable type of architecture that provides for a transfer of data between different components or devices attached to the bus system. Additionally, a communications unit may include one or more devices used to transmit and receive data, such as a modem or a network adapter. Further, a memory may be, for example, memory 106 or a cache such as found in an interface and memory controller hub that may be present in communications fabric 102.

Figure 2:
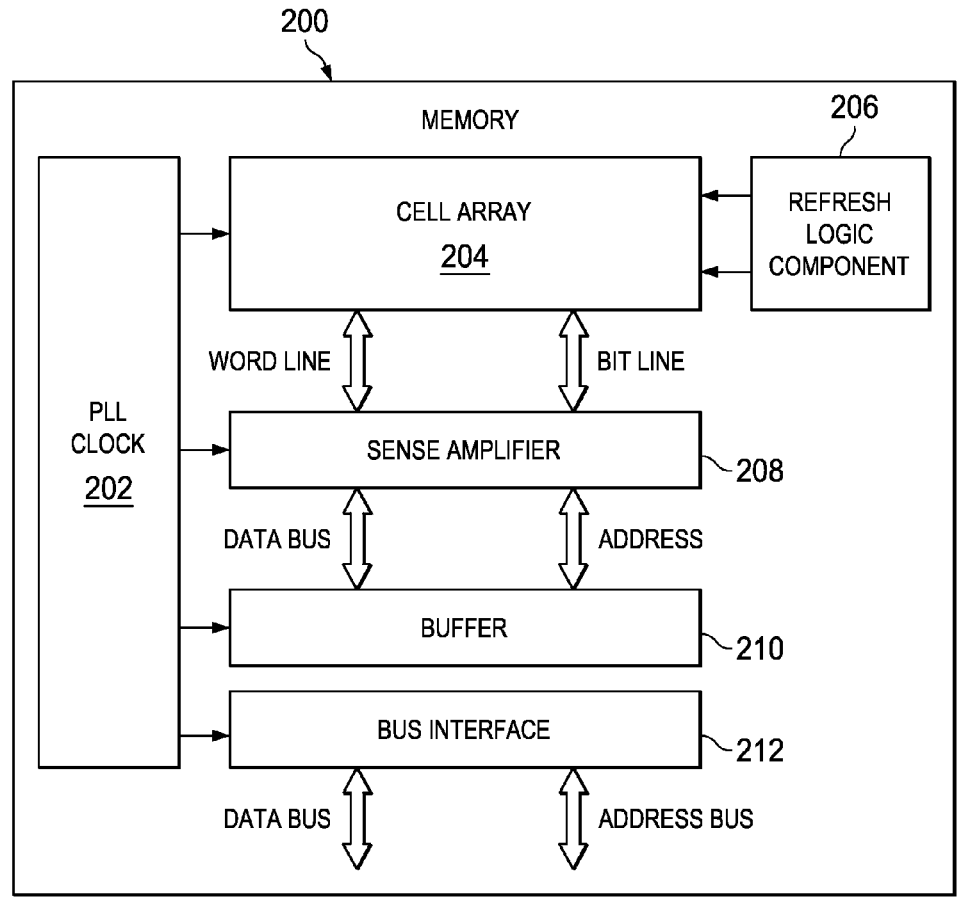
FIG. 2 is a diagram of a traditional memory structure in accordance with an illustrative embodiment.

FIG. 2 is a diagram of a traditional memory structure. Memory 200 may be implemented in a data processing system, such as data processing system 100 shown in FIG. 1. The depicted components of memory 200 are not meant to imply a specific implementation. Other illustrative embodiments of memory 200 may add, combine, or omit components depicted in memory 200. In this illustrative example, memory 200 is dynamic random access memory (DRAM). Memory 200 comprises of phase-locked loop (PLL) clock 202, cell array 204, refresh logic component 206, sense amplifier 208, buffer 210, and bus interface 212.

Phase-locked loop (PLL) clock 202 is a closed-loop frequency-control system based on the phase difference between the input clock signal and the feedback clock signal of a controlled oscillator. The lock output indicates that the PLL output clock is stable and in phase with the reference clock. The two requirements for a PLL to obtain lock are that the reference clock and feedback clock are frequency matched and phase aligned.

Cell array 204 is used to store data. Each bit of data is stored in a separate capacitor within an integrated circuit. Data may be read and written to cell array 204 using sense amplifier 208 to charge the bit lines connected to cell array 204.

Refresh logic component 206 refreshes the memory content of cell array 204 to prevent stored information from being lost. Because dynamic random access memory leak currents, refresh logic component 206 reads out the contents of cell array 204 at regular time intervals. The contents are then rewritten back to cell array 204.

Sense amplifier 208 is an electronic amplifier circuit used to sense and refresh the value of a bit stored in a cell array 204. In order to read out the value of a given bit of a word in cell array 204, the bit-cell voltage, or equivalently the magnitude of its charge, needs to be sensed, and the results of this sense operation must be delivered to the rest of the circuit.

Buffer 210 is a region of memory used to temporarily hold output or input data. Buffer 210 is used when there is a difference between the rate at which data is received and the rate at which it can be processed.

Bus interface 212 is used in communicating information from memory 200 with other devices, such as processor unit 104 shown in FIG. 1. In addition, bus interface 212 may be used to communicate information between the internal components of memory 200.

Figure 3:
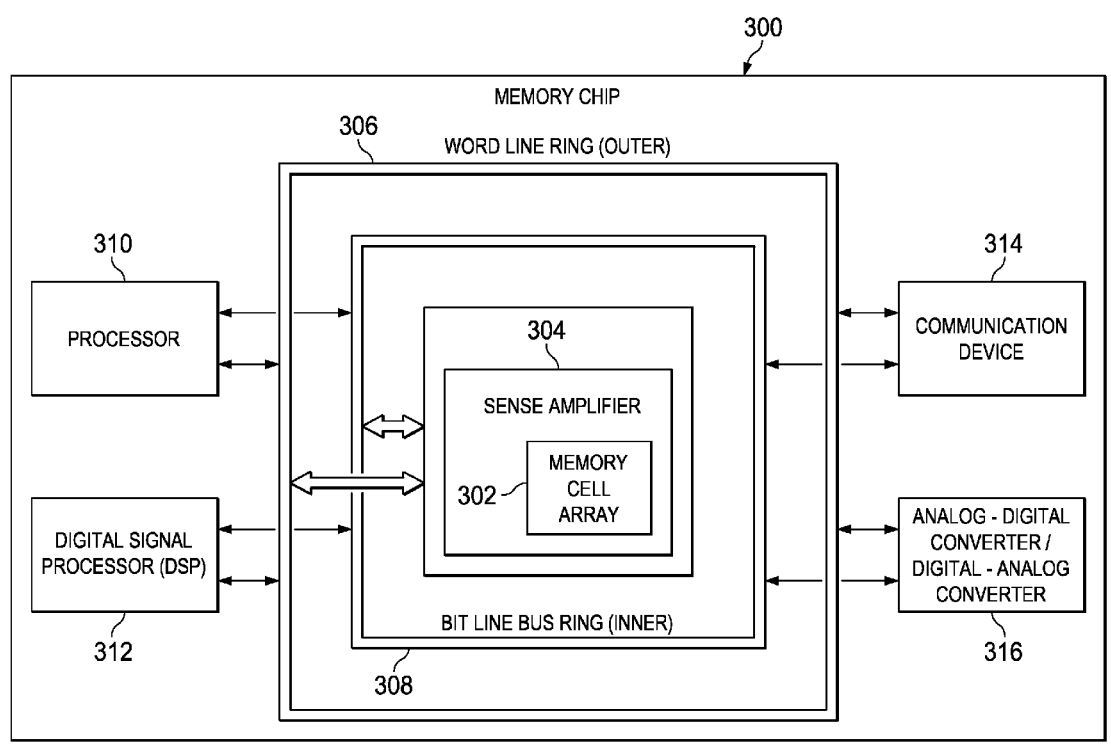
FIG. 3 is a diagram of a memory array in accordance with an illustrative embodiment.

With reference now to FIG. 3, a diagram of a memory array is depicted in accordance with an illustrative embodiment. Memory chip 300 may be implemented in a data processing system, such as data processing system 100 shown in FIG. 1. The depicted components of memory chip 300 are not meant to imply a specific implementation. Other illustrative embodiments of memory chip 300 may add, combine, or omit components depicted in memory chip 300. In this illustrative example, memory chip 300 comprises memory cell array 302, sense amplifier 304, word line ring 306, bit line bus ring 308, processor 310, digital signal processor 312, communication device 314, and analog to digital converter/digital to analog converter (ADC/DAC) 316. As referenced herein, an external memory component is any component other than a memory unit used for storing data, such as, but not limited to, memory cell array 302.

Memory cell array 302 resides in the internal core of memory chip 300. In another illustrative embodiment, memory chip 300 may also contain cache memory in the internal memory core. Memory cell array 302 is coupled to sense amplifier 304. Sense amplifier 304 is an electronic amplifier circuit used to sense and refresh the value of a bit stored in memory cell array 302.

Memory chip 300 runs to two internal rings, word line ring 306 and bit line bus ring 308, external to memory cell array 302. Word line ring 306 is used to move a word of data between the components of memory chip 300. A word is a unit of data of a defined bit length that can be addressed. Usually, the defined bit length of a word is equivalent to the width of the data bus so that a word can be moved in a single operation. For any computer architecture with an eight-bit byte, the word will be some multiple of eight bits. For example, a word may be 32 bits, or four contiguous eight-bit bytes. A word can contain a computer instruction, a storage address, or application data.

Bit line bus ring 308 is used in conjunction with word line ring 306 to read the data stored in memory cell array 302. A particular cell within memory cell array 302 is selected by designating a word line and a bit line which are arranged longitudinally and horizontally, respectively.

Current methods place the word line and bit line for accessing data internal to the memory cell array as shown in cell array 204 in FIG. 2. The illustrative embodiments recognize that data access may be increased by opening up the word line and the bit line for direct access by the processing unit(s) such as processor 310. Thus, the illustrative embodiments place the word line and the bit line external to the memory cell array for direct access by other components such as processor 310.

Processor 310 is a processing unit, such as processor unit 104 as shown in FIG. 1. Processor 310 directly accesses word line ring 306 and bit line bus ring 308 in accessing the data stored in memory cell array 302. In addition, other components may directly access word line ring 306 and bit line bus ring 308. For example, in this illustrative embodiment, digital signal processor 312, communication device 314, and analog to digital converter/digital to analog converter (ADC/DAC) 316 may also directly access word line ring 306 and bit line bus ring 308 to access data stored in memory cell array 302.

Digital signal processor 312 is a specialized digital microprocessor used to efficiently and rapidly perform calculations on digitized signals that were originally analog in form. For example, digital signal processor 312 may be used to digitize analog voice recordings.

Communication device 314 may be a modem, a wireless network device, or some other means of communicating data from memory chip 300 to an external device. For example, communication device 314 may be a Bluetooth enable chip.

Analog to digital converter/digital to analog converter (ADC/DAC) 316 is a device for converting from digital code to an analog signal, and vice versa. The digital code may be, but is not limited to, binary code. The analog signal may be, but is not limited to, current, voltage, or an electric charge. For example, analog to digital converter/digital to analog converter (ADC/DAC) 316 may be used to convert digital audio, such as MP3s, into an analog signal in order for the audio to be heard through a set of speakers.

In one illustrative embodiment, memory chip 300 tags accessed data stored in memory cell array 302 with an identifier. The identifier identifies the component, such as processor 310, currently accessing the data. Memory chip 300 uses the identifier to control the data flow between memory cell array 302 and the other components of memory chip 300.

Figure 4:
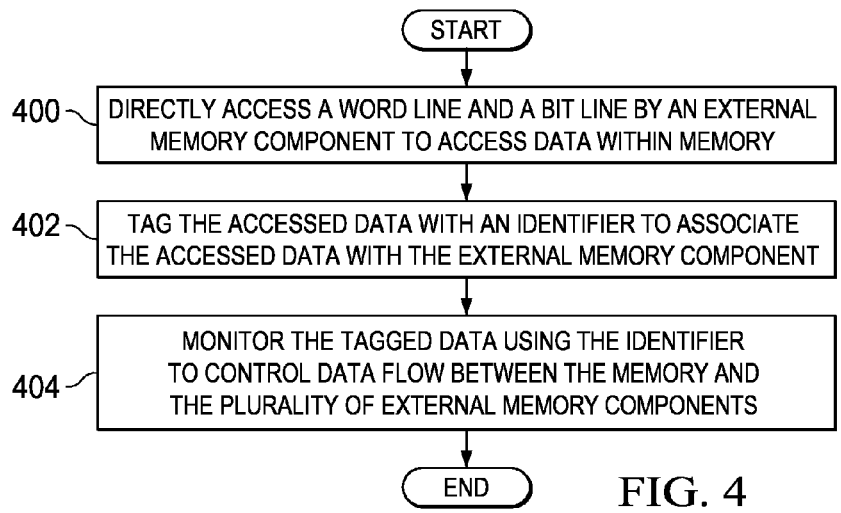
FIG. 4 is a flowchart for processing data in accordance with an illustrative embodiment.

With reference now to FIG. 4, a flowchart for processing data is depicted in accordance with an illustrative embodiment. The process of FIG. 4 may be implemented in a memory chip, such as memory chip 300 shown in FIG. 3.

The process begins by directly accessing the word line and bit line by an external memory component to access data stored in memory (step 400). The external memory component may be, but is not limited to, a processing unit, such as processor 310 as shown in FIG. 3. The process tags the accessed data with an identifier (step 402). The identifier associates the accessed data with the external memory component that is currently accessing the data. The process monitors the tagged data using the identifier to control data flow between memory and the external memory components (step 404), with the process terminating thereafter.

Accordingly, the illustrative embodiments present a memory chip for increasing efficiency associated with data access. The memory chip comprises of a plurality of memory units for storing data; a plurality of processing units for processing the data; a word line and a bit line external to the plurality of memory units, wherein the plurality of processing units directly access the word line and the bit line in accessing the data.

The illustrative embodiments increase data access efficiency by opening up the word line and the bit line for direct access by the processing unit(s) and other external memory components. As a result, the processing unit can now address the memory data down to the bit level, thereby increasing the input and output rate. In addition, by exposing the word line and the bit line for direct access, the signal path is decreased resulting in a decreased propagation time. Furthermore, by exposing the word line and the bit line for direct access, the illustrative embodiments simplify the communication protocols between memory and the processing units.

The invention can take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any tangible apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk—read only memory (CD-ROM), compact disk—read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A memory chip for increasing efficiency associated with data access, the memory chip comprises of:
   a plurality of memory units internal to the memory chip for storing data, wherein each memory unit has a set of memory cells arranged in a contiguous array of memory cells, and wherein each memory cell is configured to store a single bit of data;

a word line configured to directly move a single word of data at a time to and from the contiguous array of memory cells of each memory unit of the plurality of memory units internal to the memory chip;

a bit line configured to directly move only a single bit of data at a time to and from each memory cell of the contiguous array of memory cells of each memory unit of the plurality of memory units internal to the memory chip;

a plurality of processing units internal to the memory chip for processing the data;

the word line and the bit line configured for use by the processing units internal to the memory chip, wherein the plurality of processing units internal to the memory chip directly accesses the word line and the bit line in accessing the data;

the word line and the bit line configured for use by a plurality of processing units external to the memory chip, wherein the plurality of processing units external to the memory chip directly accesses the word line and the bit line in accessing the data.

2. The memory chip of claim 1, further comprising:

a communication device for communicating data to an external device, wherein the communication device directly accesses the word line and the bit line in accessing the data.

3. The memory chip of claim 1, further comprising:

a digital signal processor, wherein the digital signal processor directly accesses the word line and the bit line in accessing the data.

4. The memory chip of claim 1, further comprising:

an analog to digital converter/digital to analog converter, wherein the analog to digital converter/digital to analog converter directly accesses the word line and the bit line in accessing the data.

5. The memory chip of claim 1, wherein the plurality of memory units includes cache memory.

6. A computer implemented method for processing data, the computer implemented method comprising:

accessing a word line and a bit line directly by an external memory component to access data within a memory unit, wherein the word line is configured to directly move a single word of data at a time to and from a contiguous array of memory cells of each memory unit of a plurality of memory units internal to a memory chip, and wherein the bit line is configured to directly move only a single bit of data at a time to and from each memory cell of the contiguous array of memory cells of each memory unit of the plurality of memory units internal to the memory chip; and associating the data with an identifier to form tagged data, wherein the identifier identifies the external memory component that accessed the data.

7. The computer implemented method of claim 6, further comprising:

monitoring the tagged data using the identifier to control data flow between the memory unit and a plurality of external memory components.

8. The computer implemented method of claim 6, wherein the external memory component is a processing unit.

9. The computer implemented method of claim 6, wherein the external memory component is a communication device for communicating data to an external device.

10. The computer implemented method of claim 6, wherein the external memory component is a digital signal processor.

11. The computer implemented method of claim 6, wherein the external memory component is an analog to digital converter/digital to analog converter.

* * * * *